(12) United States Patent
Matsuoka et al.

(10) Patent No.: US 11,932,535 B2
(45) Date of Patent: Mar. 19, 2024

(54) MEMS DEVICE MANUFACTURING METHOD, MEMS DEVICE, AND SHUTTER APPARATUS USING THE SAME

(71) Applicant: SUMITOMO PRECISION PRODUCTS CO., LTD., Hyogo (JP)

(72) Inventors: Gen Matsuoka, Hyogo (JP); Mario Kiuchi, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 840 days.

(21) Appl. No.: 17/040,106

(22) PCT Filed: Feb. 22, 2019

(86) PCT No.: PCT/JP2019/006735
§ 371 (c)(1),
(2) Date: Sep. 22, 2020

(87) PCT Pub. No.: WO2019/187844
PCT Pub. Date: Oct. 3, 2019

(65) Prior Publication Data
US 2021/0024352 A1    Jan. 28, 2021

(30) Foreign Application Priority Data

Mar. 28, 2018 (JP) ................. 2018-061103

(51) Int. Cl.
*B81C 1/00* (2006.01)
*B81B 3/00* (2006.01)
*G02B 26/04* (2006.01)

(52) U.S. Cl.
CPC ........ *B81C 1/00666* (2013.01); *B81B 3/0072* (2013.01); *G02B 26/04* (2013.01);
(Continued)

(58) Field of Classification Search
CPC ............ B81C 1/00325; B81C 1/00333; B81C 1/00365; B81C 1/00666; B81C 1/00682
See application file for complete search history.

(56) References Cited

U.S. PATENT DOCUMENTS 7,298,954 B2    11/2007 Liu
2003/0136961 A1   7/2003 Mule'Stagno
(Continued)

FOREIGN PATENT DOCUMENTS

JP    H07-057603 A    3/1995
JP    H09-064319 A    3/1997
(Continued)

OTHER PUBLICATIONS

International Search Report for corresponding Application No. PCT/JP2019/006735, dated Apr. 23, 2019.

*Primary Examiner* — Jae Lee
(74) *Attorney, Agent, or Firm* — Renner, Otto, Boisselle & Sklar, LLP

(57) ABSTRACT

Provided is a method including at least the thermal treatment step of thermally treating a SOI substrate having a first silicon layer at a first temperature that the diffusion flow rate of an interstitial silicon atom in a silicon single crystal is higher than the diffusion flow rate of an interstitial oxygen atom and the processing step of processing the SOI substrate after the thermal treatment step to obtain a displacement enlarging mechanism.

5 Claims, 6 Drawing Sheets

(52) U.S. Cl.
CPC ... *B81B 2201/031* (2013.01); *B81B 2201/042* (2013.01); *B81C 2201/017* (2013.01)

(56) References Cited

U.S. PATENT DOCUMENTS

| | | | |
|---|---|---|---|
| 2005/0048247 A1* | 3/2005 | Mule'Stagno | H01L 21/3225 257/E21.32 |
| 2006/0055003 A1* | 3/2006 | Tomita | H01L 21/3226 257/E21.32 |
| 2008/0044669 A1 | 2/2008 | Adachi | |
| 2016/0042974 A1* | 2/2016 | Ono | C30B 15/206 257/617 |
| 2017/0050843 A1* | 2/2017 | Naruse | B81C 1/00269 |
| 2017/0183217 A1* | 6/2017 | Yin | B81B 3/0037 |
| 2019/0064505 A1 | 2/2019 | Kiuchi | |

FOREIGN PATENT DOCUMENTS

| | | |
|---|---|---|
| JP | 2005-515633 A | 5/2005 |
| JP | 2017-529683 A | 10/2017 |
| JP | 2018-025804 A | 2/2018 |
| WO | 2005/117122 A1 | 12/2005 |
| WO | 2016/011000 A1 | 1/2016 |

* cited by examiner

FIG.6

| | CONDITION A | CONDITION B | CONDITION C | CONDITION D | CONDITION E |
|---|---|---|---|---|---|
| THERMAL TREATMENT TEMPERATURE(°C) | 1000 | 1100 | 1200 | 1200 | 1200 |
| THERMAL TREATMENT TIME (HOURS) | 0.5 | 8 | 0.5 | 4 | 8 |
| PRECIPITATED OXIDE DENSITY (/cm$^2$) | $3.3 \times 10^6$ | $4.1 \times 10^5$ | $4.3 \times 10^4$ | $3.8 \times 10^4$ | $4.3 \times 10^4$ |
| STACKING FAULT DENSITY (/cm$^2$) | 0 | $8.6 \times 10^4$ | $1.73 \times 10^4$ | $1.73 \times 10^4$ | $1.73 \times 10^4$ |
| STACKING FAULT AVERAGE SIZE($\mu$m) | — | 40 | 20 | 20 | 25 |
| HTOL DRIVE TEST | NG | OK | OK | OK | OK |

MEMS DEVICE MANUFACTURING METHOD, MEMS DEVICE, AND SHUTTER APPARATUS USING THE SAME

TECHNICAL FIELD

The present invention relates to a MEMS device manufacturing method, a MEMS device, and a shutter apparatus using the MEMS device.

BACKGROUND ART

Typically, an optical apparatus configured to change an optical path by means of a MEMS (micro electro mechanical systems) device has been known. Patent Document 1 discloses a technique in which an optical waveguide coupled to a thermal actuator and provided movable in a direction parallel to a substrate surface is arranged between other optical waveguides fixed apart from each other on the substrate surface and an optical path between the optical waveguides arranged in a fixed manner is switched by drive of the thermal actuator. Note that the above-described MEMS device is manufactured using a SOI (silicon on insulator) substrate having a silicon oxide film layer between two silicon single-crystal layers.

CITATION LIST

Patent Document

PATENT DOCUMENT 1: U.S. Pat. No. 7,298,954

SUMMARY OF THE INVENTION

Technical Problem

Generally, in terms of a manufacturing cost etc., a so-called bonded SOI substrate formed in such a manner that another silicon substrate is bonded to an oxide layer formed on a surface of a silicon substrate has been often used as a SOI substrate used for manufacturing a MEMS device. Similarly, in terms of the manufacturing cost etc., these silicon substrates are manufactured using a Czochralski (CZ) method.

However, when the MEMS device as described in Patent Document 1 is produced using such a SOI substrate as a starting base material, precipitated oxide is formed at high density in a silicon layer depending on the concentration of oxygen contained in the silicon layer and thermal treatment conditions in SOI substrate production or MEMS device manufacturing, and dislocation due to such precipitated oxide might occur. Such dislocation occurs at high density in the silicon layer, leading to a probability that plastic deformation is caused in a case where the thermal actuator has been used for a long period of time. Moreover, due to such plastic deformation, there is a probability that operation reliability of the MEMS device and therefore operation reliability of a shutter apparatus are degraded.

The present invention has been made in view of such a point, and an object thereof is to provide a highly-reliable MEMS device configured such that formation of dislocation due to precipitated oxide in a silicon layer is suppressed and a shutter apparatus including the MEMS device.

Solution to the Problem

For accomplishing the above-described object, a MEMS device manufacturing method according to the present invention includes at least the thermal treatment step of thermally treating a substrate having a silicon layer at a first temperature that the diffusion flow rate of an interstitial silicon atom in a silicon single crystal is higher than the diffusion flow rate of an interstitial oxygen atom and the processing step of processing the substrate after the thermal treatment step to obtain a MEMS device.

According to this method, generation of precipitated oxide in the silicon layer can be suppressed, and the density thereof can be decreased. With this configuration, occurrence of dislocation due to the precipitated oxide can be suppressed, and operation reliability of a MEMS device can be enhanced.

Moreover, a MEMS device according to the present invention includes at least a substrate having a silicon layer, a fixing portion formed on the substrate, a thermal actuator coupled to the fixing portion and configured to generate heat by current application to displace in a predetermined direction according to a generated heat temperature, and a drive target member coupled to the thermal actuator, the precipitated oxide density of the silicon layer being equal to or less than $5 \times 10^5/cm^2$ and a member forming the thermal actuator being the silicon layer.

According to this configuration, plastic deformation in long-term use of the thermal actuator including the silicon layer as a component can be suppressed, and the operation reliability of the MEMS device can be enhanced.

A shutter apparatus according to the present invention closes or opens an optical path by a drive target member, and includes the above-described MEMS device and first and second electrodes arranged on the fixing portion and electrically connected to both end portions of the thermal actuator.

According to this configuration, the operation reliability of the MEMS device can be enhanced, and therefore, operation reliability of the shutter apparatus itself having the MEMS device can be enhanced.

Advantages of the Invention

As described above, according to the present invention, occurrence of dislocation in the silicon layer can be suppressed, and the operation reliability of the MEMS device can be enhanced.

BRIEF DESCRIPTION OF THE DRAWINGS

FIG. 6 is a table showing a precipitated oxide density, a stacking fault density, and HTOL test results in the case of different thermal treatment temperatures at a thermal oxidization step.

DESCRIPTION OF EMBODIMENTS

Hereinafter, embodiments of the present invention will be described in detail with reference to the drawings. Description of the preferable embodiments below will be set forth merely as examples in nature, and is not intended to limit the present invention, an application thereof, and a use application thereof at all.

Embodiment

[Configuration of Shutter Apparatus]

Figure 1:
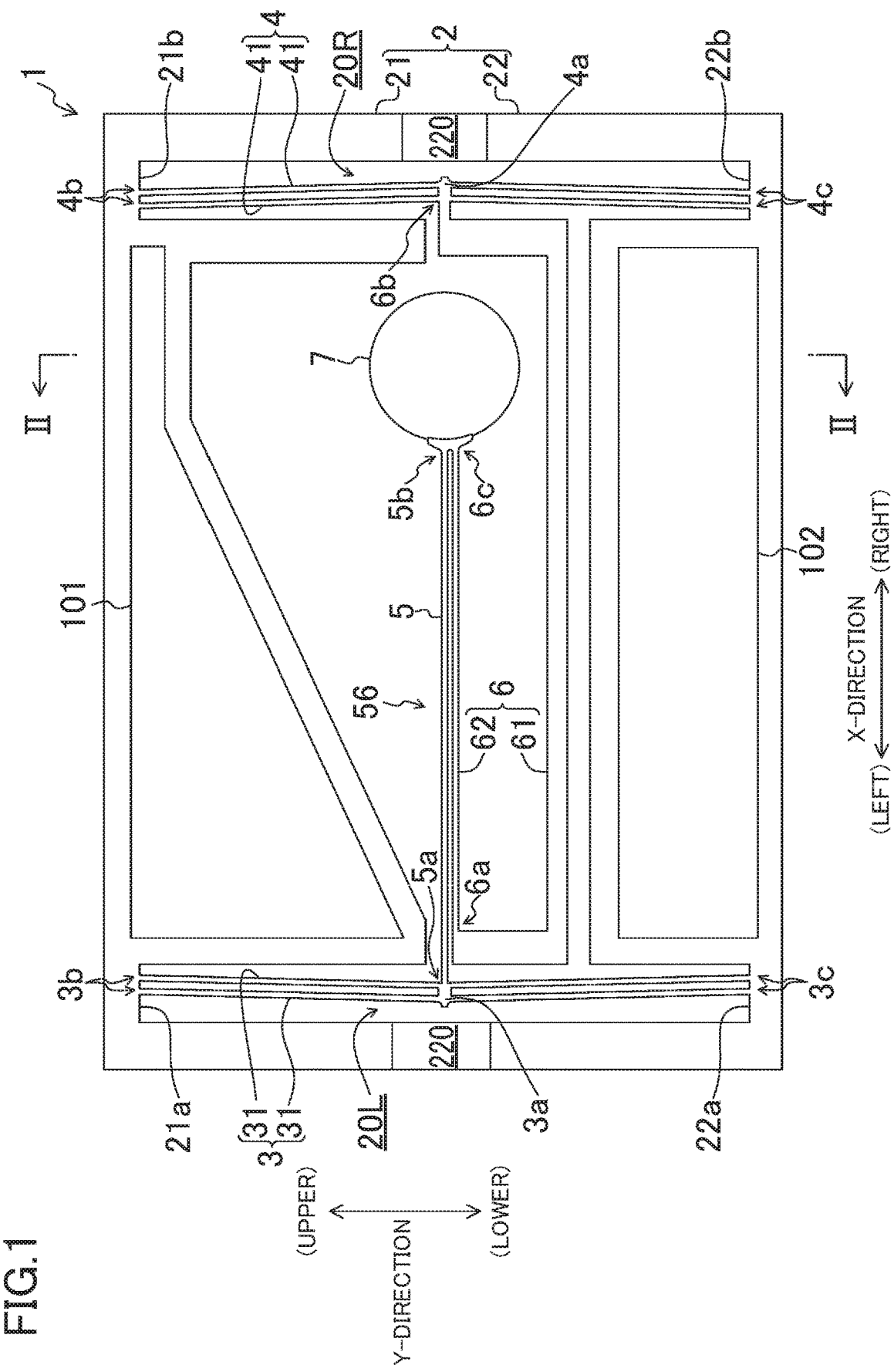
FIG. 1 is a plan view of a shutter apparatus according to a first embodiment.
Figure 2:
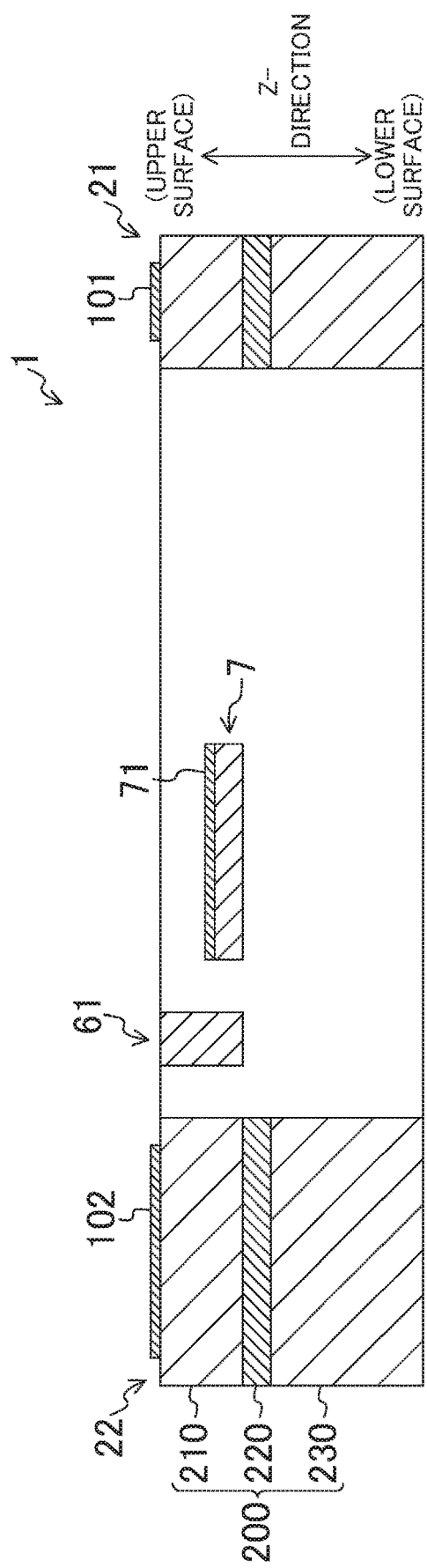
FIG. 2 is a sectional view of the shutter apparatus along an II-II line in FIG. 1.

FIG. 1 illustrates a plan view of a shutter apparatus 1 according to one embodiment of the present invention, and FIG. 2 illustrates a sectional view of the shutter apparatus 1 along an II-II line in FIG. 1. Note that, e.g., the dimensions, thickness, and detailed shape of each member drawn in the figure are, in some cases, different from actual dimensions, thickness, and shape.

The shutter apparatus 1 includes a fixing portion 2, a first actuator 3 and a second actuator 4 coupled to the fixing portion 2, a first beam 5 having a first end portion 5a and a second end portion 5b and configured such that the first end portion 5a is coupled to the first actuator 3, a second beam 6 having a third end portion 6b and a fourth end portion 6c and configured such that the third end portion 6b is coupled to the second actuator 4, a drive target member 7 coupled to the second end portion 5b of the first beam 5 and the fourth end portion 6c of the second beam 6, a first electrode 101, and a second electrode 102.

Hereinafter, a longitudinal direction of the first beam 5 will be, for the sake of convenience in description, referred to as a "X-direction," a longitudinal direction of the first actuator 3 and the second actuator 4 will be referred to as a "Y-direction," and a thickness direction of the shutter apparatus 1 will be referred to as a "Z-direction." Note that in the X-direction, a left side in FIG. 1 will be sometimes merely referred to as a "left side," and a right side in FIG. 1 will be sometimes merely referred to as a "right side." In the Y-direction, an upper side in FIG. 1 will be sometimes merely referred to as an "upper side," and a lower side in FIG. 1 will be sometimes merely referred to as a "lower side." In the Z-direction, an upper side in FIG. 2 will be sometimes referred to as an "upper surface," and a lower side in FIG. 2 will be sometimes referred to as a "lower surface." Moreover, the first end portion 5a of the first beam 5 or the third end portion 6b of the second beam 6 will be sometimes referred to as a "base end," and the second end portion 5b of the first beam 5 or the fourth end portion 6c of the second beam 6 will be sometimes referred to as a "tip end."

The shutter apparatus 1 is a so-called MEMS shutter, and is manufactured by a micromachining technique to which a semiconductor micromachining technique is applied. The shutter apparatus 1 is manufactured using a SOI substrate 200. The SOI substrate 200 is configured such that a first silicon layer 210 made of single-crystal silicon, an oxide film layer 220 made of $SiO_2$, and a second silicon layer 230 made of single-crystal silicon are stacked on each other in this order.

As described above, in the shutter apparatus 1, the fixing portion 2, the first actuator 3, the second actuator 4, the first beam 5, the second beam 6, and the drive target member 7 are integrally molded with a silicon material, thereby forming a displacement enlarging mechanism 10 (a MEMS device). Note that the oxide film layer 220 and the second silicon layer 230 remain only on the lower surfaces of a first base member 21 and a second base member 22 forming the fixing portion 2, and the oxide film layer 220 and the second silicon layer 230 at the lower surfaces of the first actuator 3, the second actuator 4, the first beam 5, the second beam 6, and the drive target member 7 as movable members are removed at a later-described manufacturing process.

As illustrated in FIG. 1, the shutter apparatus 1 has, for example, a rectangular overall shape as viewed in plane. The fixing portion 2 is a frame forming such a rectangular overall shape of the shutter apparatus 1 as viewed in plane. The fixing portion 2 includes the first base member 21 and the second base member 22 arranged facing the Y-direction.

Note that the fixing portion 2 is divided into two parts of the first base member 21 and the second base member 22 in the first silicon layer 210, but is connected as one in the oxide film layer 220 and the second silicon layer 230. Thus, the relative positions of the first base member 21 and the second base member 22 are fixed, and the first base member 21 and the second base member 22 can support the movable members.

Further, a first recessed portion 21a of the first base member 21 and a third recessed portion 22a of the second base member 22 are arranged at such positions that openings thereof face each other, and form a substantially-rectangular opening 20L elongated in the Y-direction and provided for arrangement of the first actuator 3. Similarly, a second recessed portion 21b of the first base member 21 and a fourth recessed portion 22b of the second base member 22 are arranged at such positions that openings thereof face each other, and form a substantially-rectangular opening 20R elongated in the Y-direction and provided for arrangement of the second actuator 4.

As described above, the fixing portion 2 is in a shape covering a widest possible area while movable areas of the movable members can be ensured, and therefore, ensures high stiffness necessary as the frame supporting the first actuator 3 and the second actuator 4.

The first actuator 3 includes two actuators 31 arranged in parallel. Two actuators 31 are rod-shaped thermal actuators extending in the Y-direction. As described later, the actuators 31 are formed in such a manner that the first silicon layer 210 is patterned and the oxide film layer 220 and the second silicon layer 230 positioned below the first silicon layer 210 are removed. The temperatures of the actuators 31 themselves increase due to Joule heat generated by current application to the actuators 31 themselves, and according to such a temperature increase, the actuators 31 curve in a predetermined direction. Moreover, the actuators 31 are coupled to each other at an intermediate portion 3a at the substantially center between a first end portion 3b and a second end portion 3c of the first actuator 3 in the longitudinal direction. As described above, two actuators 31 are coupled to each other at the intermediate portion 3a, and therefore, drive force of two actuators 31 is bound so that the first actuator 3 can exert great drive force. As described later, the first actuator 3 is thermally expanded by heating by power distribution to generate the drive force.

The first end portions 3b of two actuators 31 are coupled to the first base member 21 at a bottom portion of the first recessed portion 21a of the first base member 21. The second end portions 3c of two actuators 31 are coupled to the second base member 22 at a bottom portion of the third recessed portion 22a of the second base member 22.

In a precise sense, the first actuator 3 does not extend straight in the Y-direction, but slightly bends such that the intermediate portion 3a protrudes leftward in the X-direction as a drive direction of the first actuator 3 or slightly curves to entirely expand leftward in the X-direction.

The second actuator 4 includes two actuators 41 arranged in parallel. Two actuators 41 are rod-shaped members extending in the Y-direction, and are thermal actuators similar to the first actuators 31. The actuators 41 are coupled to each other at an intermediate portion 4a at the substantially center between a first end portion 4b and a second end portion 4c of the second actuator 4 in the longitudinal direction. As described above, two actuators 41 are coupled to each other at the intermediate portion 4a, and therefore, drive force of two actuators 41 is bound so that the second actuator 4 can exert great drive force. As described later, the second actuator 4 is thermally expanded by heating by power distribution to generate the drive force.

The first end portions 4b of two actuators 41 are coupled to the first base member 21 at a bottom portion of the second recessed portion 21b of the first base member 21. The second end portions 4c of two actuators 41 are coupled to the second base member 22 at a bottom portion of the fourth recessed portion 22b of the second base member 22.

In a precise sense, the second actuator 4 does not extend straight in the Y-direction, but slightly bends such that the intermediate portion 4a protrudes rightward in the X-direction as a drive direction of the second actuator 4 or slightly curves to entirely expand rightward in the X-direction. Moreover, as described above, the first actuator 3 and the second actuator 4 bend or curve with respect to the drive direction thereof, and therefore, upon thermal expansion due to heating, do not bend or curve to the opposite side of the drive direction. Thus, the first actuator 3 and the second actuator 4 can reliably bend or curve in the drive direction.

As described above, the first actuator 3 is arranged on the left side in the X-direction in the shutter apparatus 1, the second actuator 4 is arranged on the right side in the X-direction in the shutter apparatus 1, and the first actuator 3 and the second actuator 4 face each other as viewed in plane.

The drive target member 7 is arranged between the first actuator 3 and the second actuator 4 facing each other. Moreover, the first beam 5 and the second beam 6 are coupled to the drive target member 7. The drive target member 7 is formed thinner than other members forming the MEMS device 10. Thus, the mass of the drive target member 7 is decreased, and a resonance frequency is increased. Moreover, a metal film 71 such as an Au/Ti film is formed across the entire surface of the drive target member 7. In the shutter apparatus 1, the drive target member 7 functions as a shutter configured to close or open a not-shown optical path. Thus, the drive target member 7 is formed in a planar shape slightly larger than the section of the optical path, and is specifically formed in a circular shape. Moreover, a not-shown radiation portion is formed at a coupling portion between each of the first beam 5 and the second beam 6 and the drive target member 7, and has the function of releasing heat generated at the first actuator 3 upon drive of the first actuator 3 and transmitted from the first actuator 3 through the first beam 5 and/or heat generated at the second actuator 4 upon drive of the second actuator 4 and transmitted from the second actuator 4 through the second beam 6.

The first beam 5 is a rod-shaped member extending in the X-direction. The first end portion 5a of the first beam 5 is coupled to the intermediate portion 3a of the first actuator 3. The second end portion 5b of the first beam 5 is coupled to the drive target member 7.

The second beam 6 is a member having a turned-back structure, and includes a first member 61 extending from the intermediate portion 4a of the second actuator 4 to the vicinity of the intermediate portion 3a of the first actuator 3 and a second member 62 turned back to the second actuator 4 from an end portion 6a of the first member 61. The third end portion 6b (i.e., the base end on a first member 61 side) of the second beam 6 is coupled to the intermediate portion 4a of the second actuator 4. The fourth end portion 6c (i.e., the tip end on a second member 62 side) of the second beam 6 is coupled to the drive target member 7.

The second member 62 is a rod-shaped member extending in the X-direction from the end portion 6a of the first member 61 and having the substantially-same thickness as that of the first beam 5. The second member 62 is arranged in parallel with the first beam 5 on a side slightly lower than the first beam 5 in the Y-direction. Note that "the first beam 5 and the second member 62 of the second beam 6 are arranged in parallel" indicates, including description below, that the first beam 5 and the second member 62 of the second beam 6 are arranged with a substantially-parallel relationship being maintained. Moreover, a portion 56 at which the first beam 5 and the second member 62 of the second beam 6 are arranged in parallel with each other will be sometimes referred to as a "parallel arrangement portion 56." That is, the first beam 5 and the second member 62 of the second beam 6 are, in parallel, coupled to the drive target member 7 from the same direction. In other words, the tip end side of the first beam 5 is turned back at the not-shown radiation portion, and therefore, at the coupling portion between each of the first beam 5 and the second beam 6 and the drive target member 7, the first beam 5 and the second member 62 of the second beam 6 are arranged in parallel.

The first member 61 is a member having, e.g., a hook shape extending around the drive target member 7. Moreover, the first member 61 has, at least at part thereof, a highly-elastic region to have a higher elastic modulus than that of the second member 62, and is formed wider, for example. As described later, even when the second beam 6 is driven by the second actuator 4, the first member 61 remains in the hook shape with little elastic deformation, and transmits the drive force of the second actuator 4 to the second member 62. In addition, the highly-elastic region may be formed in such a manner that part of the first member 61 is formed thicker than the second member 62 or a metal film is formed on part of the first member 61. Note that the second actuator 4 of the present embodiment may be omitted, and the second beam 6 may be directly coupled to the fixing portion 2. Specifically, the second beam 6 may include only the second member 62, and an end portion on a side opposite to the fourth end portion 6c of the second member 62 may be directly coupled to the fixing portion 2 (the first base member 21 or the second base member 22). In this case, the second member 62 may be directly coupled to the fixing portion 2 in a substantially-straight state or a state with a slight curvature, or the vicinity of the end portion on the side opposite to the fourth end portion 6c of the second member 62 may be folded and coupled to the fixing portion 2.

The first electrode 101 is a metal film formed on the upper surface of the first base member 21, such as an Au/Ti film.

The second electrode 102 is a metal film formed on the upper surface of the second base member 22, such as an Au/Ti film.

[Operation of Shutter Apparatus]

Figure 3:
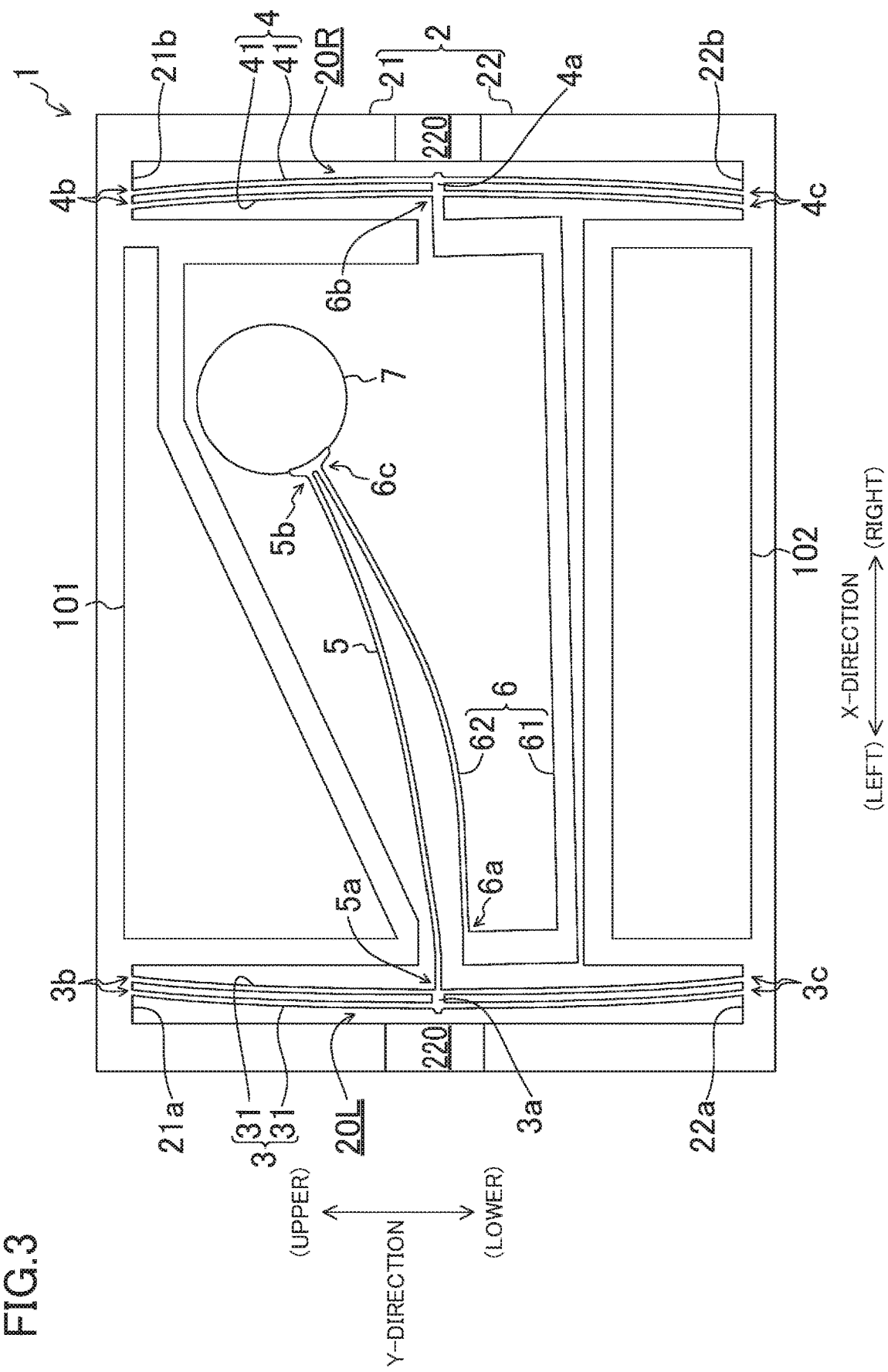
FIG. 3 is a plan view of the shutter apparatus in a drive state.

Subsequently, operation of the shutter apparatus 1 configured as described above will be described. FIG. 3 illustrates a plan view of the shutter apparatus 1 in a drive state.

The shutter apparatus 1 is driven in such a manner that voltage is applied to between the first electrode 101 and the second electrode 102. When voltage is applied to between the first electrode 101 and the second electrode 102, current flows in the first actuator 3 and the second actuator 4 through the first base member 21 and the second base member 22. At this point, Joule heat is generated at the first actuator 3 and the second actuator 4 made of the silicon material, and the first actuator 3 and the second actuator 4 are instantaneously heated to 400 to 500° C.

The first actuator 3 is thermally expanded by heating such that the entire length thereof is extended. The positions of the first end portion 3b and the second end portion 3c of the first actuator 3 are fixed by the fixing portion 2, and therefore, the intermediate portion 3a is pushed leftward in the X-direction as a direction in which the intermediate portion 3a protrudes in advance.

The second actuator 4 is also thermally expanded by heating such that the entire length thereof is extended. The positions of the first end portion 4b and the second end portion 4c of the second actuator 4 are fixed by the fixing portion 2, and therefore, the intermediate portion 4a is pushed rightward in the X-direction as a direction in which the intermediate portion 4a protrudes in advance.

When the intermediate portion 3a of the first actuator 3 is pushed leftward in the X-direction, the first beam 5 coupled thereto is entirely pulled leftward in the X-direction. Moreover, when the intermediate portion 4a of the second actuator 4 is pushed rightward in the X-direction, the second beam 6 coupled thereto is entirely pulled rightward in the X-direction.

That is, the relative positions of the first end portion 5a of the first beam 5 and the third end portion 6b of the second beam 6 change in a direction in which these end portions are apart from each other.

Even when the second beam 6 is entirely pulled rightward in the X-direction, the first member 61 of the second beam 6 is little elastically deformed, and therefore, most of pull force by the second beam 6 is concentrated on the end portion 6a and changes to the force of pushing the second member 62 rightward in the X-direction. Of the first beam 5 and the second member 62 of the second beam 6 arranged in parallel, the first beam 5 is, as a result, pulled leftward in the X-direction, and the second member 62 of the second beam 6 is pushed rightward in the X-direction. Thus, the second end portion 5b of the first beam 5 and the fourth end portion 6c of the second beam 6 are driven diagonally to an upper left side on an XY plane, the first beam 5 and the second member 62 of the second beam 6 greatly curve or bend with different curvatures, and the fourth end portion 6c of the second beam 6 pushes the drive target member 7. Meanwhile, the second end portion 5b of the first beam 5 pulls the drive target member 7. Thus, the first member 61 of the second beam 6 slightly rotates counterclockwise about the third end portion 6b on the XY plane, and the drive target member 7 is pushed to a position on the XY plane as illustrated in FIG. 5. Moreover, the second actuator 4 is configured such that the multiple actuators are coupled to each other as in the present embodiment, and therefore, as compared to a case where the second actuator 4 includes one actuator, counterclockwise rotational stiffness of the first member 61 of the second beam 6 about the third end portion 6b on the XY plane can be enhanced.

On the other hand, when voltage is no longer applied to between the first electrode 101 and the second electrode 102, current no longer flows in the first actuator 3 and the second actuator 4, and the first actuator 3 and the second actuator 4 are rapidly naturally cooled and the extended entire lengths thereof return to original lengths. At this point, the intermediate portion 3a of the first actuator 3 pushed leftward in the X-direction is pulled back rightward in the X-direction, and the intermediate portion 4a of the second actuator 4 pushed rightward in the X-direction is pulled back leftward in the X-direction.

When the intermediate portion 3a of the first actuator 3 is pulled back rightward in the X-direction, the first beam 5 coupled thereto is entirely pulled back rightward in the X-direction. Moreover, when the intermediate portion 4a of the second actuator 4 is pulled back leftward in the X-direction, the second beam 6 coupled thereto is entirely pulled back leftward in the X-direction.

That is, the relative positions of the first end portion 5a of the first beam 5 and the third end portion 6b of the second beam 6 change in a direction in which these end portions approach each other.

Even when the second beam 6 is entirely pulled back leftward in the X-direction, the first member 61 of the second beam 6 is little elastically deformed, and therefore, most of drawing force by the second beam 6 is concentrated on the end portion 6a and changes to the force of pushing the second member 62 leftward in the X-direction. Of the first beam 5 and the second member 62 of the second beam 6 arranged in parallel, the first beam 5 is, as a result, pushed rightward in the X-direction, and the second member 62 of the second beam 6 is pulled leftward in the X-direction. Thus, the second end portion 5b of the first beam 5 and the fourth end portion 6c of the second beam 6 are pushed back diagonally to a lower right side on the XY plane, and the curved or bent first beam 5 and the curved or bent second member 62 of the second beam 6 return to original substantially-straight shapes. The first member 61 of the second beam 6 slightly rotates clockwise about the third end portion 6b on the XY plane to return to an original position, and the drive target member 7 returns to a position on the XY plane as illustrated in FIG. 1.

Note that the first beam 5 may push the drive target member 7 while the second beam 6 pulls the drive target member 7.

As described above, by switching between voltage application (the drive state of the shutter apparatus 1) to the first electrode 101 and the second electrode 102 and cancellation (a non-drive state of the shutter apparatus 1) of such voltage application, the position of the drive target member 7 on the XY plane is switched as illustrated in FIGS. 5 and 1. The not-shown optical path is arranged to overlap with the drive target member 7 illustrated in FIG. 1 or the drive target member 7 illustrated in FIG. 5. The position of the drive target member 7 is switched as illustrated in FIGS. 5 and 1, and therefore, the drive target member 7 functions as the shutter configured to close or open the not-shown optical path. The not-shown optical path may be closed at such a position that the drive target member 7 is not driven by the first actuator 3 and the second actuator 4, and may be opened at such a position that the drive target member 7 is driven. Conversely, the not-shown optical path may be opened at such a position that the drive target member 7 is not driven by the first actuator 3 and the second actuator 4, and may be closed at such a position that the drive target member 7 is driven. Moreover, the shutter is a concept including an optical attenuator configured to close or open part of the optical path other than closing or opening of the optical path.

[Findings Leading to the Invention of the Present Application]

The inventor(s) of the present application et al. has found that in a case where a high temperature operating life test (hereinafter referred to as a "HTOL test") is performed for the shutter apparatus 1 illustrated in FIGS. 1 and 2, the frequency of defects greatly varies according to a product lot and a main defect mode in this case is malfunction of the first and/or second actuators 3, 4.

After further analysis had been conducted, it has been found that in the shutter apparatus 1 determined as defective, the first and/or second actuators 3, 4 are plastically deformed. Moreover, in this case, it has been found that silicon oxide is precipitated into the first silicon layer 210 at high density. This has assumed that at the step of manufacturing the SOI substrate 200 or the step of manufacturing the shutter apparatus 1, a silicon oxide precipitate (hereinafter referred to as "precipitated oxide") is generated in the first silicon layer 210 forming the first and/or second actuators 3, 4 in thermal treatment of the SOI substrate 200. Moreover, in the case of the same number of silicon atoms, the volume of the silicon oxide is greater than the volume of a silicon single crystal. It has been assumed that dislocation occurs in the first silicon layer 210 due to volume expansion upon generation of the precipitated oxide and a dislocation density increases to a certain value or more to cause plastic deformation of the first and/or second actuators 3, 4.

Generally, it has been found that plastic deformation in a solid crystal greatly depends on dislocation in the crystal, particularly the density or size thereof. In a state in which the first and/or second actuators 3, 4 deformed due to thermal expansion are held for the long period of time, a state in which stress is on the first silicon layer 210 forming the first and/or second actuators 3, 4 is maintained. Moreover, in a state in which heating and cooling of the first and/or second actuators 3, 4 are often repeated, a change in the stress on the first silicon layer 210 forming the first and/or second actuators 3, 4 becomes great. In any case, it has been assumed that when dislocation occurs at high density in the first silicon layer 210, dislocation movement in the crystal due to the stress is accelerated and plastic deformation of the first and/or second actuators 3, 4 is caused.

For this reason, the inventor(s) of the present application et al. has first conducted study on whether or not a defect can be reduced by reduction in an oxygen concentration in the first silicon layer 210. If the oxygen concentration can be reduced, the density of the precipitated oxide can be reduced, needless to say. However, in terms of a manufacturing cost, the first silicon layer 210 is generally formed using a silicon substrate (hereinafter referred to as a "CZ-silicon substrate") formed by a CZ method. It has been known that in the CZ method, oxygen is taken into silicon melt from, e.g., a quartz crucible and remains as an interstitial oxygen element in a silicon single crystal. A general oxygen concentration in the CZ-silicon substrate is about $5 \times 10^{17}/cm^3$ to $1 \times 10^{18}/cm^3$. For reducing the oxygen concentration in the silicon substrate to a value equal to or less than this value, such as equal to or less than $1 \times 10^{17}/cm^3$, methods are conceivable, in which the silicon substrate is produced by a floating zone method or a silicon single-crystal layer is grown by an epitaxial growth method on the CZ-silicon substrate and is used as the first silicon layer 210.

However, any method leads to a higher cost for manufacturing the silicon substrate as compared to the CZ method, and it is difficult to apply these methods to the MEMS device for which inexpensive production is demanded.

For this reason, study has been conducted on whether or not a dislocation occurrence density due to the precipitated oxide can be reduced. It has been found that an interstitial oxygen atom and a silicon atom contained in the silicon single crystal are chemically bound to each other to generate the precipitated oxide and the density, shape, and size of the precipitated oxide change due to a temperature provided to the silicon single crystal. For example, such behavior is described in detail in a Sueoka's first research paper (Journal of Applied Physics, 1993, vol. 74, p. 5437-5444).

In the shutter apparatus 1 determined as defective, it is assumed that the density of the precipitated oxide increases and the size of the precipitated oxide increases in thermal treatment of the SOI substrate 200 at the step of manufacturing the SOI substrate 200 or the step of manufacturing the shutter apparatus 1 and a volume around the precipitated oxide greatly changes. It is assumed that due to such a situation, high-density dislocation is caused.

The above-described Sueoka's first research paper also describes a finding regarding behavior of the interstitial oxygen atom in the silicon single crystal, and the inventor(s) of the present application et al. has focused on this point. According to this finding, it has been found that the coefficients of diffusion of the interstitial oxygen atom and the interstitial silicon atom in the silicon single crystal are reversed at 1000° C. Considering this point, it is assumed that the diffusion flow rate of the interstitial oxygen atom is higher than the diffusion flow rate of the interstitial silicon atom at 1000° C. or lower and the diffusion flow rate of the interstitial silicon atom is higher than the diffusion flow rate of the interstitial oxygen atom at over 1000° C. The diffusion flow rate described herein indicates the amount of atoms passing through a unit area per unit time, and a unit is represented by $mol/cm^2 \cdot s$, for example.

Based on this finding, the inventor(s) of the present application et al. has found that a thermal treatment temperature at the step of manufacturing the shutter apparatus 1 including the displacement enlarging mechanism (the MEMS device) 10 is properly controlled, and in this manner, the precipitated oxide and occurrence of dislocation due to the precipitated oxide can be reduced and failure due to reliability degradation of the displacement enlarging mechanism (MEMS device) 10 and the shutter apparatus 1 can be reduced. Details will be described below.

[SOI Substrate Manufacturing Method and Shutter Apparatus Manufacturing Method]

Figure 4A:
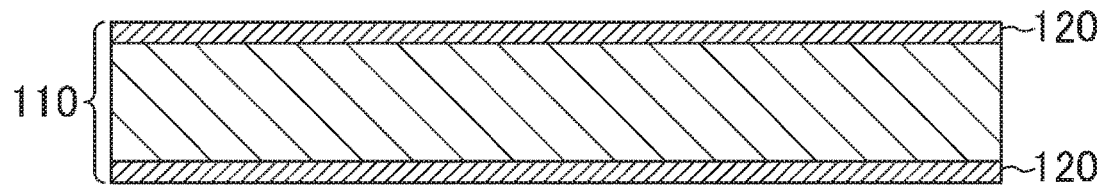
FIG. 4A is a sectional view illustrating one step in the method for manufacturing a SOI substrate.
Figure 4B:
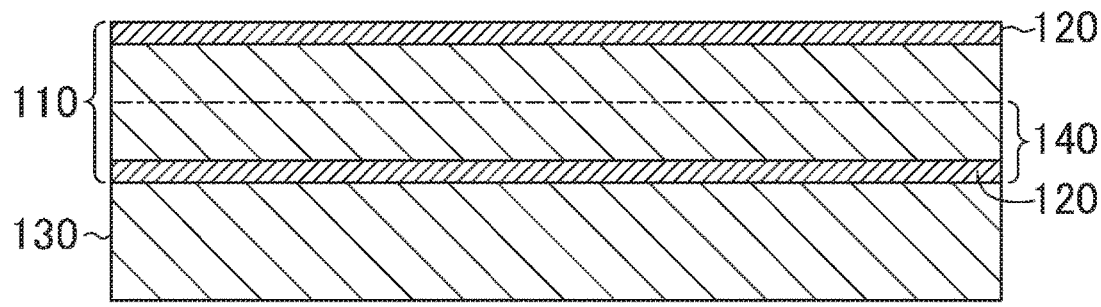
FIG. 4B is a sectional view illustrating one step in the method for manufacturing the SOI substrate.
Figure 4C:
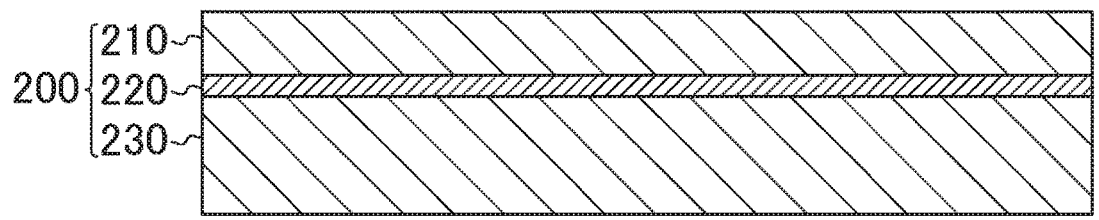
FIG. 4C is a sectional view illustrating one step in the method for manufacturing the SOI substrate.

FIGS. 4A to 4C illustrate sectional views at each step of a SOI substrate manufacturing method according to the present embodiment, and FIGS. 5A to 5D illustrate sectional views at each step of a shutter apparatus manufacturing method.

First, the method for manufacturing the SOI substrate 200 as a base material of the shutter apparatus 1 will be described. As described above, in production of the MEMS device 10, a bonded SOI substrate is generally used in terms of cost reduction.

As illustrated in FIG. 4A, a device substrate 110 and a base substrate 130 are prepared. Both of the device substrate 110 and the base substrate 130 are produced by the CZ method, and have a predetermined concentration such as the above-described oxygen concentration of about $5 \times 10^{17}/cm^3$ to $1 \times 10^{18}/cm^3$. An oxide film layer 120 is formed on a surface of the device substrate 110. The oxide film layer 120 is formed in such a manner that the device substrate 110 is thermally oxidized (hereinafter referred to as "wet oxidation") in atmosphere containing water vapor. The thickness of the oxide film layer 120 is equal to or greater than 1 μm, and a thermal treatment temperature in the wet oxidation is about 1050° C. Further, the device substrate 110 and the base substrate 130 are washed to clean each surface.

Next, as illustrated in FIG. 4B, a principal surface of the device substrate 110 and a principal surface of the base substrate 130 are bonded to each other at a room temperature and joined to each other. Further, in this state, thermal treatment is performed at a predetermined temperature. Joint between the device substrate 110 and the base substrate 130 becomes stronger by such thermal treatment. The thermal treatment is performed in non-oxidizing atmosphere, and the thermal treatment temperature is about 990° C., for example.

As illustrated in FIG. 4C, the device substrate 110 bonded to the base substrate 130 is divided in the thickness direction such that a portion 140 of the device substrate 110 remains on the base substrate 130. The portion 140 of the device substrate 110 is polished, and is adjusted such that a silicon single-crystal layer of the portion 140 has a desired thickness. The device substrate 110 is not necessarily divided in the thickness direction, and may be polished and adjusted such that the silicon single-crystal layer has the desired thickness.

In this manner, the SOI substrate 200 is obtained. The silicon single-crystal layer of the portion 140 of the device substrate 110 corresponds to the first silicon layer 210 as a device layer, the oxide film layer 120 corresponds to the oxide film layer 220 as a Box layer, and the base substrate 130 corresponds to the second silicon layer 230 as a handle layer.

Subsequently, the method for manufacturing the shutter apparatus 1 will be described. Note that the sectional views of the manufacturing steps illustrated in FIGS. 5A to 5E each correspond to sectional views along the II-II line of FIG. 1.

Figure 5A:
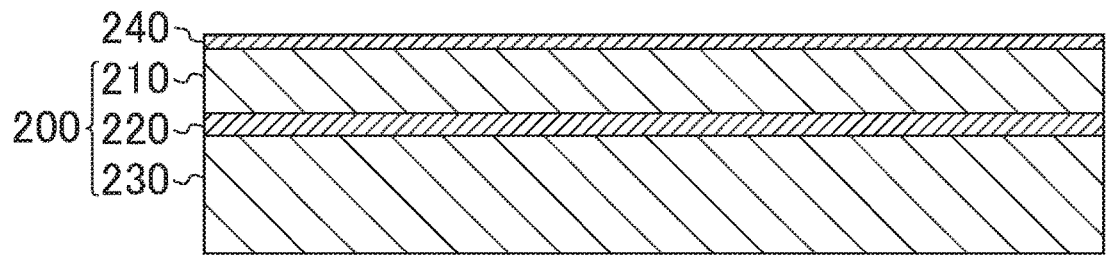
FIG. 5A is a sectional view illustrating one step in the method for manufacturing the shutter apparatus.

The SOI substrate 200 produced by the method illustrated in FIGS. 4A to 4C is prepared. For example, the thickness of the device layer 210 is 30 μm, the thickness of the Box layer 220 is 1 μm, and the thickness of the handle layer 230 is 250 μm. As illustrated in FIG. 5A, the SOI substrate 200 is wet-oxidized, and an oxide film layer 240 is formed on a surface of the first silicon layer 210. A treatment temperature in thermal oxidation is higher than 1000° C., and thermal oxidization treatment is performed at 1050° C., for example. Moreover, thermal oxidation is performed such that the thickness of the oxide film layer 240 is about several tens to hundreds of nanometers. Note that it may be enough that the oxide film layer 240 has a thickness necessary as an etching mask in etching of the later-described first silicon layer 210. Note that in description below, the step illustrated in FIG. 5A, i.e., a step until the wet oxidization after the SOI substrate 200 has been prepared, will be sometimes referred to as a "substrate preparation step."

Figure 5B:
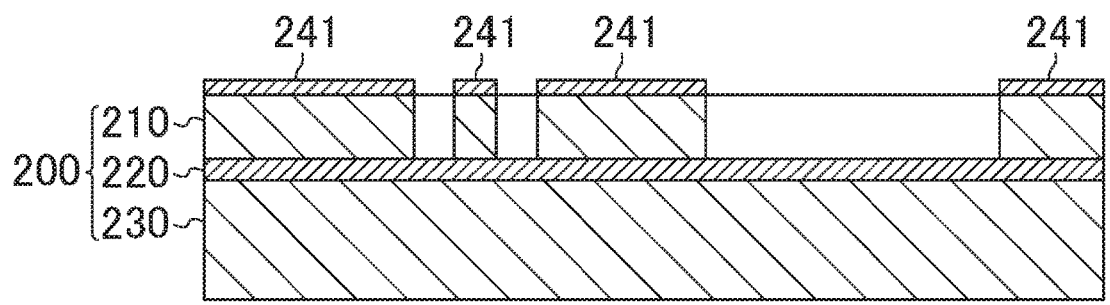
FIG. 5B is a sectional view illustrating one step in the method for manufacturing the shutter apparatus.

As illustrated in FIG. 5B, a not-shown resist pattern is formed on a surface of the oxide film layer 240 by a photolithography method, and is used as a mask to etch the oxide film layer 240. In this manner, a mask pattern 241 is obtained.

Figure 5C:
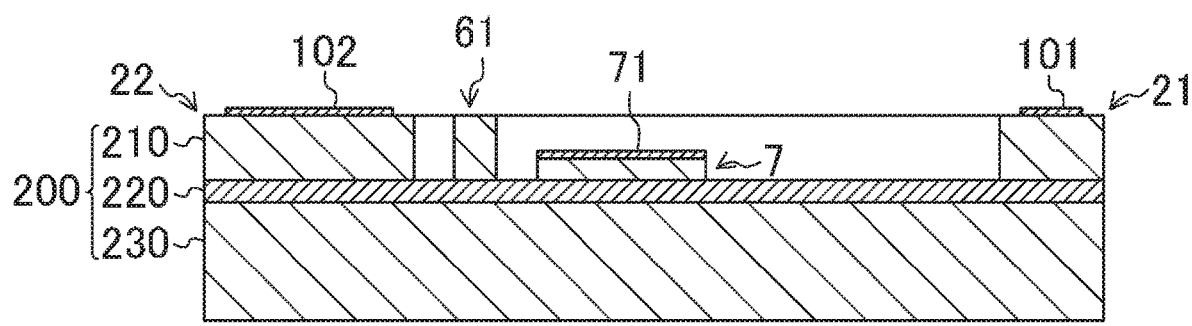
FIG. 5C is a sectional view illustrating one step in the method for manufacturing the shutter apparatus.

Next, as illustrated in FIG. 5C, the mask pattern 241 is used as an etching mask to etch the first silicon layer 210 as the device layer. In this manner, an original form of the displacement enlarging mechanism (the MEMS device) 10 including the fixing portion 2, the first actuator 3, the second actuator 4, the first beam 5, the second beam 6, and the drive target member 7 is integrally formed in the first silicon layer 210. Note that in FIG. 5C, only part of the displacement enlarging mechanism (the MEMS device) 10 is illustrated for the sake of convenience. Moreover, after the displacement enlarging mechanism (the MEMS device) 10 has been integrally formed, the mask pattern 241 is removed.

Particularly, the number of times of etching for the drive target member 7 is greater than that for the other members by one, and the drive target member 7 is formed thinly to have a thickness of about 7 μm. That is, although not shown in the figure, the thickness of the drive target member 7 is less than the thicknesses of the first actuator 3, the second actuator 4, the first beam 5, and the second beam 6. Further, the first electrode 101 is formed on a surface of the first base member 21, the second electrode 102 is formed on a surface of the second base member 22, and the metal film 71 is formed on the surface of the drive target member 7. The electrodes 101, 102 and the metal film 71 are, for example, Au/Ti films including Ti with a thickness of 20 nm and Au with a thickness of 300 nm.

Figure 5D:
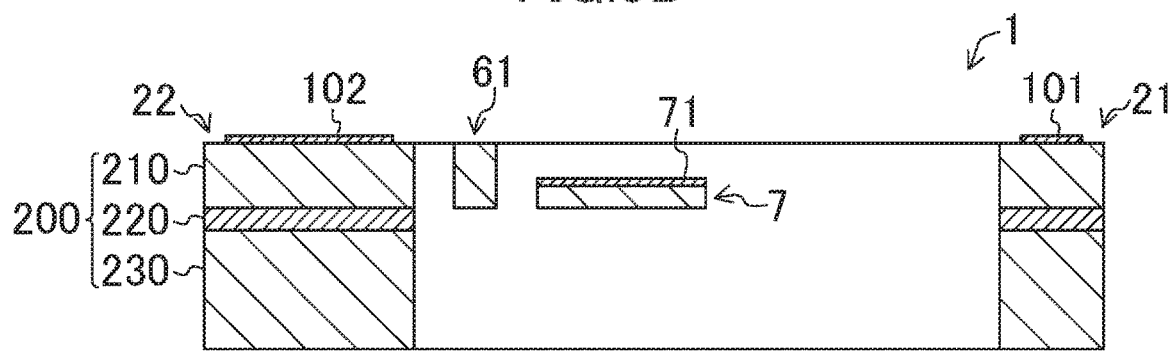
FIG. 5D is a sectional view illustrating one step in the method for manufacturing the shutter apparatus.

As illustrated in FIG. 5D, when the original form of the shutter apparatus 1 is formed in the first silicon layer 210 as the device layer, a dummy wafer (not shown) is subsequently bonded to the device layer 210 with wax (not shown), and a back layer, i.e., the Box layer 220 and the handle layer 230, of the shutter apparatus 1 is etched. By such etching, the SOI substrate 200, in this case a multilayer structure of the device layer 210, the Box layer 220, and the handle layer 230, remains in the fixing portion 2, and only the first silicon layer 210 as the device layer remains in the first actuator 3, the second actuator 4, the first beam 5, the second beam 6, and the drive target member 7 as the movable members in the displacement enlarging mechanism (MEMS device) 10.

Finally, the wax (not shown) and the dummy wafer (not shown) are removed, and the shutter apparatus 1 is finalized.

[Relationship Among Thermal Treatment Temperature, Densities of Precipitated Oxide Etc., and Defect Occurrence Frequency]

From the findings disclosed in the above-described Sueoka's first research paper, the inventor(s) of the present application et al. has derived the following hypothesis.

First, when the CZ-silicon substrate is thermally treated at a temperature of equal to or lower than 1000° C., the interstitial oxygen atom in silicon is chemically bound to the near silicon atom to generate a minute silicon oxide nucleus. Moreover, in this temperature range, the interstitial oxygen atom is more easily movable than the interstitial silicon atom. Thus, the interstitial oxygen atom is thermally diffused, bound to the above-described nucleus, and grown to the precipitated oxide, and the size thereof increases. Moreover, due to growth of the precipitated oxide, lattice strain therearound becomes greater. Due to such lattice strain, dislocation occurs in the silicon single crystal. Moreover, a dislocation density increases according to a precipitated oxide occurrence density. As described above, plastic deformation of the first and/or second actuators 3, 4 including the first silicon layer 210 as the silicon single-crystal layer is caused, and therefore, the failure due to reliability degradation of the shutter apparatus 1 is caused.

On the other hand, when the CZ-silicon substrate is thermally treated at a temperature higher than 1000° C., the precipitated oxide is generated as in the above-described case, but in this temperature range, the interstitial silicon atom is more easily movable than the interstitial oxygen atom. Thus, the precipitated oxide is not grown much as compared to the above-described case, and the occurrence density decreases. Thus, it has been assumed that the dislocation occurrence density due to the precipitated oxide can be suppressed low, plastic deformation of the first and/or second actuators 3, 4 can be prevented, and the failure due to reliability degradation of the shutter apparatus 1 can be reduced.

For this reason, the inventor(s) of the present application et al. has focused on the thermal oxidization step illustrated in FIG. 5A at the steps of manufacturing the shutter apparatus 1 as illustrated in FIGS. 5A to 5D, and for different treatment temperatures, has checked the precipitated oxide density and the defect occurrence frequency of the shutter apparatus 1. As a result, tendency showed that the defect occurrence frequency of the shutter apparatus 1 is low in a case where a stacking fault density is equal to or greater than $1 \times 10^4/cm^2$ and is much lower in a case where the stacking fault density is equal to or greater than $1 \times 10^4/cm^2$ and equal to or less than $5 \times 10^4/cm^2$. Moreover, tendency showed that the defect occurrence frequency is low in a case where the precipitated oxide density is equal to or less than $5 \times 10^5/cm^2$ and is much lower in a case where the precipitated oxide density is equal to or less than $1 \times 10^5/cm^2$. Further, tendency showed that the defect occurrence frequency is lower in a case where both of the above-described conditions regarding the stacking fault density and the precipitated oxide density are satisfied than in a case where either one of the conditions is satisfied. These conditions can be combined as necessary.

FIG. 6 illustrates one example of the precipitated oxide density, the stacking fault density, and HTOL test results of the shutter apparatus 1 in the case of different thermal treatment temperatures at the thermal oxidization step illustrated in FIG. 5A. Note that in FIG. 6, observation of the precipitated oxide and a stacking fault and derivation of the density were performed in a state after the SOI substrate 200 has been thermally oxidized, and the shutter apparatus 1 was not directly analyzed. Moreover, in FIG. 6, the shape of an etch pit in the first silicon layer 210 formed by dipping in a Wright etching solution was observed, and the number of etch pits corresponding to defects due to the precipitated oxide was obtained within a field of view with a predetermined area in an optical microscope and the precipitated oxide density was derived. Moreover, actual defect type, shape, and size were checked by the optical microscope or a scanning electron microscope (SEM). Similarly, the presence or absence, density, and size of the stacking fault were checked by the optical microscope or the scanning electron microscope (SEM). Moreover, when the percentage of the number of products determined as defective in the HTOL test is equal to or lower than a predetermined value, it is determined as successful (O.K.). When such a percentage exceeds the predetermined value, it is determined as unsuccessful (N.G.).

As illustrated in FIG. 6, in a case where in a case where the thermal treatment temperature is a low temperature of 1000° C. (CONDITION A), the precipitated oxide density exceeded $1 \times 10^6/cm^2$, and an evaluation result in the HTOL test was N.G. Moreover, in a case where the thermal treatment temperature is 1100° C. exceeding 1000° C. (CONDITION B), the precipitated oxide density was equal to or less than $5 \times 10^5/cm^2$, and the evaluation result in the HTOL test was O.K. In a case where the thermal treatment temperature is 1200° C. exceeding 1000° C. (CONDITIONS C to E), the precipitated oxide density was less than $5 \times 10^4/cm^2$, and the evaluation result in the HTOL test was O.K.

According to a Sueoka's second research paper (Koji Sueoka, "Study on Oxide Precipitation in CZ-Si Single Crystal and Oxidization-Induced Stacking Fault," Doctoral Degree Thesis of Kyoto University, 1997, p. 2), the shape of precipitated oxide in a silicon single crystal at a low temperature (650° C. to 1050° C.) is a plate shape, and the shape of precipitated oxide in a silicon single crystal at a high temperature (1000° C. to 1250° C.) is an isolated polyhedral shape. In comparison between TEM bright-field images of these precipitated oxides disclosed in the Sueoka's second research paper, strain occurs around the plate-shaped precipitated oxide in the silicon single crystal, whereas no such strain is conformed around the isolated polyhedral precipitated oxide. From this finding, it is assumed that the precipitated oxide generated by the thermal treatment under Condition A has a higher density than those under Conditions B to E and the shape thereof is also different and is a plate shape. As described above, when the plate-shaped precipitated oxide is generated, lattice strain therearound becomes greater, and for this reason, dislocation easily occurs. On the other hand, it is assumed that in the thermal treatment under Conditions B to E, the isolated polyhedral precipitated oxide is generated, but lattice strain therearound is small and the dislocation density is smaller as compared to Condition A.

Moreover, the stacking fault is present in the first silicon layer 210 separately from the precipitated oxide. Under Condition A where the thermal treatment temperature is 1000° C., no stacking fault is confirmed within the predetermined field of view by microscope observation. On the other hand, under Condition B where the thermal treatment temperature is 1100° C., the stacking fault density is greater than $5 \times 10^4/cm^2$. Under Conditions C to E where the thermal treatment temperature is 1200° C., the stacking fault density is a value greater than $1 \times 10^4/cm^2$.

As generally known, the stacking fault is a fault caused due to partial distortion of atom periodic arrangement on a crystal lattice plane in a single crystal. On the other hand, dislocation is a fault that displacement of atom arrangement of a crystal lattice is in a linear shape. Under Condition A, it is assumed as follows: the silicon atom present around the precipitated oxide and the interstitial oxygen atom having moved by thermal diffusion are bound to each other during thermal oxidization, and growth of the precipitated oxide and occurrence of dislocation in the first silicon layer 210 progress; whereas the interstitial silicon atom is mainly consumed by occurrence and growth of the precipitated oxide, and therefore, the stacking fault is not increased much.

Conditions B to E are at such a temperature that the interstitial silicon atom is more easily movable than the interstitial oxygen atom, and therefore, the interstitial silicon atom is bound to the interstitial oxygen atom and moves around the precipitated oxide without being taken into the precipitated oxide. It is assumed that in the course of decreasing the temperature, the interstitial silicon atom is arranged at an irregular position between crystal lattice planes, and the number of times of occurrence of the stacking fault increases as compared to the case (Condition A) where the thermal treatment temperature is 1000° C. Moreover, it has been known that the stacking fault interacts with dislocation and suppresses dislocation movement in the crystal. It is assumed that under Conditions B to E, the evaluation results in the HTOL test are more favorable than that under Condition A because of influence of the stacking fault generated at a higher density than that under Condition A. Summarizing the above-described results, it has been verified that the above-described hypothesis is correct.

Advantages Effects Etc.

As described above, in the present embodiment, for manufacturing the shutter apparatus 1 including the displacement enlarging mechanism (the MEMS device) 10, the thermal oxidization step of thermally oxidizing the SOI substrate 200 having the first silicon layer 210 at the temperature higher than 1000° C., i.e., at such a temperature that the diffusion flow rate of the interstitial silicon atom in the silicon single crystal is higher than the diffusion flow rate of the interstitial oxygen atom, and the processing step of processing the SOI substrate 200 after the thermal oxidization step are at least performed.

Focusing on the precipitated oxide density, for manufacturing the shutter apparatus 1 including the displacement enlarging mechanism (the MEMS device) 10, the substrate preparation step of preparing the SOI substrate 200 having the first silicon layer 210 whose precipitated oxide density is equal to or less than $5\times10^5/cm^2$ and the processing step of processing the SOI substrate 200 after the substrate preparation step are at least performed.

From another point of view, for manufacturing the shutter apparatus 1 including the displacement enlarging mechanism (the MEMS device) 10, the substrate preparation step of preparing the SOI substrate 200 having the first silicon layer 210 whose stacking fault density is equal to or greater than $1\times10^4/cm^2$ and the processing step of processing the SOI substrate 200 after the substrate preparation step are at least performed. It can be also said that the substrate preparation step of preparing the SOI substrate 200 having the first silicon layer 210 whose precipitated oxide density is equal to or less than $5\times10^5/cm^2$ and whose stacking fault density is equal to or greater than $1\times10^4/cm^2$ and the processing step of processing the SOI substrate 200 after the substrate preparation step are at least performed.

By thermal oxidization of the SOI substrate 200 at a temperature higher than 1000° C., generation of the precipitated oxide in the first silicon layer 210 as the device layer can be suppressed, and the density thereof can be reduced. Thus, occurrence of dislocation due to the precipitated oxide can be suppressed, and plastic deformation when the first and second actuators 3, 4 as movable portions in the displacement enlarging mechanism (the MEMS device) 10 are used for a long period of time can be suppressed. As a result, operation reliability of the displacement enlarging mechanism (the MEMS device) 10 and therefore operation reliability of the shutter apparatus 1 can be enhanced. Note that in terms of only precipitated oxide generation suppression and occurrence density reduction, the thermal treatment temperature may be around 1410° C. as a silicon melting point when exceeding 1000° C., but is actually preferably equal to or lower than 1270° C. because substrate warpage become greater or a new crystal fault is caused when exceeding 1300° C.

From still another point of view, the SOI substrate 200 having the first silicon layer 210 satisfying a precipitated oxide density of equal to or less than $5\times10^5/cm^2$, a stacking fault density of $1\times10^4/cm^2$, or both is prepared, and is processed to obtain the displacement enlarging mechanism (the MEMS device) 10. Thus, dislocation occurrence and/or dislocation movement due to the precipitated oxide can be suppressed, and plastic deformation of the first and second actuators 3, 4 as the movable portions in the displacement enlarging mechanism (the MEMS device) 10 can be suppressed. As a result, the operation reliability of the displacement enlarging mechanism (the MEMS device) 10 and therefore the operation reliability of the shutter apparatus 1 can be enhanced.

In recent years, in production of the SOI substrate 200 by a bonding method, bonding strength is ensured while substrate warpage and metal impurity diffusion are reduced, and therefore, tendency shows that the thermal treatment temperature after bonding is decreased. A temperature range selected at this point is often a temperature around 1000° C. and lower than 1000° C.

However, when the bonding temperature is lower than 1000° C., the precipitated oxide density becomes higher in the first silicon layer 210, and the dislocation occurrence density due to the precipitated oxide also becomes higher, as described above. Thus, by performing the thermal oxidization step or the substrate preparation step described in the present embodiment, even when the shutter apparatus 1 is manufactured using the SOI substrate 200 produced by the final thermal treatment at a temperature of equal to or lower than 1000° C., plastic deformation of the first and second actuators 3, 4 upon long-term use thereof can be suppressed, and the operation reliability of the displacement enlarging mechanism (the MEMS device) 10 and therefore the operation reliability of the shutter apparatus 1 can be enhanced.

After the wet oxidization step illustrated in FIG. 5A, in other words, after the substrate preparation step, if the precipitated oxide is generated at high density or dislocation due to the precipitated oxide occurs at high density, plastic deformation of the first and second actuators 3, 4 cannot be suppressed, leading to degradation of the operation reliability of the shutter apparatus 1. For this reason, it is necessary to avoid the precipitated oxide from substantially growing at the step performed after the wet oxidization step. Specifically, at the step performed after the wet oxidization step (after the substrate preparation step), the temperature applied to the SOI substrate 200 including the first silicon layer 210 needs to be set to a temperature lower than 1000° C., i.e., equal to or lower than a temperature that the diffusion flow rate of the interstitial oxygen atom in the silicon single crystal is higher than the diffusion flow rate of the interstitial silicon atom and that the precipitated oxide contained in the first silicon layer 210 does not substantially grown. With reference to the above-described Sueoka's first and second research papers, the temperature needs to be set to equal to or lower than 600° C.

Note that according to the findings disclosed in these research papers, even when the temperature applied to the SOI substrate 200 is 700° C., it takes several tens to several hundreds of hours to grow the precipitated oxide, and therefore, treatment at equal to or lower than 700° C. can be incorporated into the step of manufacturing the shutter apparatus 1 while treatment time is taken into consideration.

The first silicon layer 210 as the device layer is formed using the CZ-silicon substrate. Thus, the cost of the first silicon layer 210 can be reduced, and the manufacturing cost of the displacement enlarging mechanism (the MEMS device) 10 and therefore the manufacturing cost of the shutter apparatus 1 can be reduced.

In a case where the first silicon layer 210 is wet-oxidized to form the oxide film layer 240, the above-described processing step includes at least the mask pattern formation step of forming the mask pattern 241 for processing the first silicon layer 210 and the silicon layer processing step of patterning the first silicon layer 210 by means of the mask pattern 241.

In the semiconductor micromachining technique, patterning of a silicon oxide film is technically established, and is also a step which can be performed at low cost. Since the oxide film layer 240 is used as described above, the mask pattern 241 having sufficient etching resistance can be formed in subsequent etching of the first silicon layer 210. This is because the thickness of the first silicon layer 210 is about 30 µm and the first silicon layer 210 cannot be processed into a desired shape due to a change in a mask pattern shape or elimination of a pattern itself in etching of the first silicon layer 210 in the case of a mask pattern including a resist, as described above. Note that when the thickness of the first silicon layer 210 is smaller than the above-described value, such as about several the first silicon layer 210 may be patterned using the mask pattern including the resist.

In some cases, instead of the above-described thermal oxidization step for the SOI substrate 200, the thermal treatment might be performed in non-oxidizing atmosphere or atmosphere containing a slight amount of oxidized gas. For example, these cases include a case where a high concentration of p-type or n-type impurities is contained in the first silicon layer 210 and an attempt is made to decrease the electric resistivity of the first silicon layer 210 by activation of these impurities by the thermal treatment. In this case, the thermal treatment is performed at the temperature that the diffusion flow rate of the interstitial silicon atom in the silicon single crystal is higher than the diffusion flow rate of the interstitial oxygen atom. Thus, plastic deformation of the first and second actuators 3, 4 can be also suppressed, and the operation reliability of the displacement enlarging mechanism (the MEMS device) 10 and therefore the operation reliability of the shutter apparatus 1 can be also enhanced.

The MEMS device 10 according to the present embodiment includes at least the SOI substrate 200 having the first silicon layer 210, the fixing portion 2 formed on the SOI substrate 200, the first and second actuators 3, 4 as the thermal actuators coupled to the fixing portion 2 and configured to generate heat by current application to displace in the predetermined direction according to the generated heat temperature, and the first and second beams 5, 6 and the drive target member 7 coupled to the first and second actuators 3, 4. Moreover, the condition where the precipitated oxide density of the first silicon layer 210 is equal to or less than $5 \times 10^5/cm^2$, the condition where the stacking fault density of the first silicon layer 210 is equal to or less than $1 \times 10^4/cm^2$, or both are satisfied.

Since the MEMS device 10 is configured as described above, plastic deformation of the first and second actuators 3, 4 as the thermal actuators including the first silicon layer 210 as a component can be suppressed, and the operation reliability of the displacement enlarging mechanism (the MEMS device) 10 can be enhanced.

The shutter apparatus 1 according to the present embodiment includes the displacement enlarging mechanism (the MEMS device) 10 having the above-described characteristics and the first and second electrodes 101, 102 arranged on the fixing portion 2 and electrically connected to the end portions 3b, 3c, 4b, 4c of the first and second actuators 3, 4, and closes or opens the optical path by the drive target member 7.

Since the shutter apparatus 1 is configured as described above, the operation reliability of the displacement enlarging mechanism (the MEMS device) 10 can be enhanced, and therefore, the operation reliability of the shutter apparatus 1 itself can be enhanced.

Note that as illustrated in FIG. 3, during operation of the shutter apparatus 1, not only the first and second actuators 3, 4 but also first and second beams 5, 6 greatly curve, and stress is on these components. Moreover, as described above, in drive of the first and second actuators 3, 4, heat propagates to the first and second beams 5, 6 from these actuators. Further, the first and second beams 5, 6 also include the first silicon layer 210 as in the first and second actuators 3, 4.

That is, by performing the manufacturing method of the present embodiment described above, not only plastic deformation of the first and second actuators 3, 4 but also plastic deformation of the first and second beams 5, 6 can be suppressed. As a result, the operation reliability of the displacement enlarging mechanism (the MEMS device) 10 and therefore the operation reliability of the shutter apparatus 1 can be enhanced. Moreover, in the displacement enlarging mechanism (the MEMS device) 10 and the shutter apparatus 1, plastic deformation of the first and second beams 5, 6 can be suppressed, and the operation reliability of the displacement enlarging mechanism (the MEMS device) 10 and therefore the operation reliability of the shutter apparatus 1 can be enhanced.

Moreover, according to the displacement enlarging mechanism (the MEMS device) 10, the first actuator 3 and the second actuator 4 are coupled to the fixing portion 2, the first end portion 5a of the first beam 5 is coupled to the first actuator 3, the third end portion 6b of the second beam 6 is coupled to the second actuator 4, and the drive target member 7 is coupled to the second end portion 5b of the first beam 5 and the fourth end portion 6c of the second beam 6. The first beam 5 pulls the drive target member 7 from the second end portion 5b in an extension direction of the first beam 5 while the second beam 6 pushes the drive target member 7 from the fourth end portion 6c in an extension direction of the second beam 6. Thus, the drive target member 7 coupled to these beams 5, 6 is driven. That is, drive force of the first beam 5 and the second beam 6 each driven by the first actuator 3 and the second actuator 4 is combined to drive the drive target member 7. Thus, the drive target member 7 can be greatly displaced by slight displacement of the first actuator 3 and the second actuator 4 as drive members.

In the shutter apparatus 1, when voltage is applied to between the first electrode 101 and the second electrode 102, current flows in the first actuator 3 and the second actuator 4, and the first actuator 3 and the second actuator 4 are heated and thermally deformed. Accordingly, the first beam 5 and the second beam 6 are driven to drive the drive target member 7 coupled to these two beams 5, 6. Thus, the drive target member 7 can be greatly displaced by low-voltage application to between the first electrode 101 and the second electrode 102.

Other Embodiments

The embodiment has been described above as an example of the technique disclosed in the present application. However, the technique disclosed in the present disclosure is not limited to above, and is also applicable to embodiments to which changes, replacements, additions, omissions, etc. are made as necessary. Moreover, the components described above in the embodiment may be combined to form a new embodiment. Further, the components illustrated in the attached drawings and described in the detailed description may include not only components essential for solving the problems, but also components provided as an example of the above-described technique and not essential for solving the problems. For this reason, it shall not be acknowledged that illustration and description of these non-essential components in the attached drawings and the detailed description directly mean that these non-essential components are essential.

Note that each of the first actuator 3 and the second actuator 4 may include a single actuator. Moreover, the sizes and structures of the first actuator 3 and the second actuator 4 are not necessarily the same as each other, but may be different from each other. The number of actuators forming the first actuator 3 or the second actuator 4 may be different between the first actuator 3 and the second actuator 4, and for example, the first actuator 3 includes a single actuator and the second actuator 4 includes two actuators. Moreover, the length of the member forming the first actuator 3 and the length of the member forming the second actuator 4 may be different from each other. Further, only either one of the first actuator 3 or the second actuator 4 may be driven to drive the drive target member 7. In addition, either one of the first actuator 3 or the second actuator 4 may be omitted. In this case, only the beam coupled to the non-omitted actuator may have a radiation structure.

In the above-described embodiment, the displacement enlarging mechanism 10 included in the shutter apparatus 1 has been described as one example of the MEMS device, but the MEMS device according to the present invention is not limited to above as long as the MEMS device includes the thermal actuator configured to generate heat by Joule heat generated by current application to the thermal actuator itself to displace in the predetermined direction according to the generated heat temperature and the drive target member coupled to the thermal actuator. Moreover, the above-described "drive target member coupled to the thermal actuator" includes not only the drive target member 7 illustrated in FIGS. 1 to 3, but also the first and second beams 5, 6, needless to say.

The MEMS device according to the present invention is also applicable to apparatuses other than the shutter apparatus 1 described above in the embodiment. For example, the MEMS device may be applied to an optical path changing apparatus configured to tilt a mirror by a thermal actuator to change the direction of light entering the mirror and a wavelength selection filter apparatus configured to tilt a wavelength selection filter provided instead of a mirror by a thermal actuator to modulate light having entered an upper surface of the filter to emit light with a predetermined wavelength from a lower surface of the filter.

INDUSTRIAL APPLICABILITY

According to the MEMS device manufacturing method according to the present invention, occurrence of dislocation in the silicon layer forming the MEMS device can be suppressed. Thus, the operation reliability of the MEMS device can be enhanced, and the MEMS device manufacturing method is particularly useful in application to the MEMS device having the movable portion.

DESCRIPTION OF REFERENCE CHARACTERS

1 Shutter Apparatus
2 Fixing Portion
10 Displacement Enlarging Mechanism (Mems Device)
21 First Base Member
22 Second Base Member
3 First Actuator
3a Intermediate Portion
3b First End Portion
3c Second End Portion
4 Second Actuator
4a Intermediate Portion
4b First End Portion
4c Second End Portion
5 First Beam
56 Parallel Arrangement Portion
5a First End Portion
5b Second End Portion
6 Second Beam
6b Third End Portion
6c Fourth End Portion
7 Drive Target Member
101 First Electrode
102 Second Electrode
200 SOI Substrate (Substrate)
210 First Silicon Layer
220 Oxide Film Layer
230 Second Silicon Layer

The invention claimed is:

1. A MEMS device manufacturing method comprising: at least
   a substrate preparation step of preparing a substrate having a silicon layer whose precipitated oxide density is equal to or less than $5\times10^5/cm^2$ and whose stacking fault density is equal to or greater than $1\times10^4/cm^2$; and
   a thermal treatment step of thermally treating the substrate at a first temperature that a diffusion flow rate of an interstitial silicon atom in a silicon single crystal is higher than a diffusion flow rate of an interstitial oxygen atom, wherein
   at a step performed after the thermal treatment step, a temperature applied to the silicon layer is equal to or lower than a second temperature that the diffusion flow rate of the interstitial oxygen atom in the silicon single crystal is higher than the diffusion flow rate of the interstitial silicon atom and precipitated oxide contained in the silicon layer does not substantially grow,
   the first temperature is higher than 1000° C. and the second temperature is lower than 1000° C., and
   the method further comprises a processing step of processing the substrate after the thermal treatment step to obtain a MEMS device.

2. The MEMS device manufacturing method according to claim 1, wherein
   the substrate is a multilayer bonded substrate configured such that a handle layer, an insulating layer, and a device layer are stacked on each other in this order, and
   the device layer is the silicon layer, and is formed using a silicon substrate manufactured by a Czochralski (CZ) method.

3. The MEMS device manufacturing method according to claim 2, wherein
   the silicon layer contains a predetermined concentration of oxygen, and the predetermined concentration is in a range of $5\times10^{17}/cm^3$ to $1\times10^{18}/cm^3$.

4. The MEMS device manufacturing method according to claim 3, wherein
   the processing step includes at least
   a mask pattern formation step of forming a mask pattern for processing the silicon layer; and
   the mask pattern includes a thermally-oxidized film formed on a surface of the substrate at the thermal treatment step.

5. The MEMS device manufacturing method according to claim 1, wherein
   the MEMS device includes at least a thermal actuator configured to generate heat by current application to displace in a predetermined direction according to a generated heat temperature and a drive target member coupled to the thermal actuator.

\* \* \* \* \*